United States Patent [19]

Milgate, III

[11] Patent Number: 4,836,233

[45] Date of Patent: Jun. 6, 1989

[54] METHOD AND APPARATUS FOR VENTING VACUUM PROCESSING EQUIPMENT

[75] Inventor: Robert W. Milgate, III, Gloucester, Mass.

[73] Assignee: Eclipse Ion Technology, Inc., Beverly, Mass.

[21] Appl. No.: 203,009

[22] Filed: Jun. 6, 1988

[51] Int. Cl.[4] ............................................. F16K 24/04
[52] U.S. Cl. ..................................... 137/14; 137/486; 118/50; 437/949
[58] Field of Search ................... 137/1, 14, 486, 487.5; 118/50, 663; 437/7, 949; 148/169

[56] References Cited

U.S. PATENT DOCUMENTS 3,665,945  5/1972  Otterstein .............................. 137/14
4,100,310  7/1978  Ura et al. ......................... 437/949 X
4,207,910  6/1980  Muller ................................... 137/14
4,739,787  4/1988  Stoltenberg ........................... 137/14

Primary Examiner—A. Michael Chambers
Assistant Examiner—John C. Fox
Attorney, Agent, or Firm—Lahive & Cockfield

[57] ABSTRACT

Controlled, low-turbulence venting of a semiconductor processing vacuum chamber is provided by a venting system including sensing elements for sensing gas conditions, including pressure, in the chamber during venting, and vent rate control elements, including a flow rate regulator valve, responsive to the sensing elements for attaining a venting rate approaching a selected maximal venting rate threshold of sonically choked flow, thereby attaining enhanced non-sonically-choked venting.

16 Claims, 2 Drawing Sheets

METHOD AND APPARATUS FOR VENTING VACUUM PROCESSING EQUIPMENT

BACKGROUND

This invention relates to the processing of semiconductor wafers in a vacuum chamber and, more broadly, relates to apparatus and methods for reducing particulate contamination of workpieces processed in vacuum equipment.

The fabrication of integrated circuits utilizes a number of processes which involve the application of high energy beams onto semiconductor wafers in vacuum. These processes include ion implantation, ion beam milling and reactive ion etching.

Conventional ion implantation systems and other semiconductor wafer fabrication equipment utilize processing chambers which are maintained at high vacuum during ion implantation or other energy delivery. When such vacuum chambers are vented following processing, significant aerodynamic forces develop in the incoming vent gas. These aerodynamic forces dislodge trace particulates present on surfaces within the chamber, such as on the platen and on interior surfaces of the vacuum chamber and of the vacuum lock. The aerodynamic forces thereby mobilize the particulates, which then come to rest on the wafer surface being processed. In particular, the initial inrush of gas during an uncontrolled vent operation can create shock waves which render the trace particulates airborne and can deposit them on the wafer surface. The presence of such particulates contaminates the wafer surface, and thereby can render the resultant semiconductor inoperative.

Particulate contamination of semiconductor wafers is a recognized problem in commercial semiconductor manufacture. It causes a significant fraction of wafer production to be discarded, and hence reduces production yield. The problem of particulate contamination becomes more severe as very large scale integration (VLSI) technology advances and circuit dimensions become ever smaller. As circuit linewidth decreases so that linewidth approaches particulate size, this form of contamination results in an increased failure rate and decreased yield. Currently, particulates as small as one half micron can necessitate rejection of a semiconductor wafer.

One approach directed at reducing particulate contamination involves the use of clean room environments having filtration and precipition facilities for removing particulates from the processing environment. A significant population of particulates in the 0.5 micron range, however, can exist even in clean room environments.

Other conventional techniques for minimizing contamination include stringent cleaning of the vacuum chamber and vacuum lock surfaces. Another technique involves designing material-handling systems so that all handling mechanisms are beneath the wafer, whereby fewer particulates fall upon the wafer. While these techniques tend to reduce total particulate count, they do not assure a processing chamber entirely free of trace particulates.

Certain prior semiconductor wafer fabrication systems utilize sharply restricted gas inflow or vent rates during the entire vent operation, in an effort to reduce turbulence in the vacuum chamber and the vacuum lock and thereby to reduce particulate contamination. Such systems, however, have low wafer throughput due to the resultant prolonged vent times, for example in some instances of approximately three minutes. Total implantation time, in contrast, is typically a fraction of a minute and in some instances is no greater than fifteen seconds per wafer. A three-minute vent time is estimated to slow down total process time by approximately 25%. Such increases in total process time are detrimental in commercial semiconductor processing, in which a major objective is the attainment of high throughput. Conventional semiconductor wafer processing systems, in summary, do not attain low particulate contamination levels in combination with high throughput.

Accordingly, there exists a need for vacuum processing methods and apparatus, for semiconductor wafers and other workpieces, which provide reduced particulate contamination while maintaining high processing speeds and wafer throughput.

It is thus an object of the invention to provide improved vacuum processing methods and apparatus.

It is another object of the invention to provide methods and apparatus for rapidly venting a vacuum chamber or vacuum lock while preventing or reducing particulate contamination of the workpiece being processed.

It is a further object of the invention to provide methods and apparatus for reducing turbulent venting flow in the vacuum lock of vacuum equipment while maintaining enhanced vent rates and processing speeds.

Other general and specific objects of the invention will in part be obvious and will in part appear hereinafter.

SUMMARY OF THE INVENTION

The invention attains the foregoing and other objects by providing apparatus and methods for the controlled venting of a processing vacuum chamber. One aspect of the invention includes providing sensing elements for sensing gas conditions in the chamber during venting, and vent rate control elements responsive to the sensing elements. The control elements attain a venting rate approaching a selected maximal venting rate threshold of sonically-choked flow, and thereby attain enhanced non-sonically-choked venting.

Another aspect of the invention provides chamber pressure sensing elements for sensing gas pressure in the chamber, and for generating a pressure signal representative of gas pressure in the chamber. This aspect of the invention also provides gas flow sensing elements for sensing gas flow rate into the chamber, and for generating a flow rate signal representative of the rate of gas flow into the chamber.

The invention also includes control elements arranged for regulating the rate of gas flow into the chamber in response to an applied control signal. The control elements, connected with the chamber pressure sensing elements and the vent sensing elements, generate the applied control signal responsive to the gas pressure signal and the gas flow rate signal, for attaining a rate of gas flow into the chamber approaching a selected maximal flow rate threshold of sonically choked flow, thereby attaining enhanced non-sonically-choked gas flow.

The control elements can include pressure-responsive elements for generating the applied control signals to control gas flow as a function of chamber pressure, and in particular, to increase gas flow linearly with, or otherwise in proportion to, increasing chamber pressure.

In another aspect of the invention, the control elements include valve elements for selectively reducing the rate of gas flow into the chamber, and the gas flow sensing elements include pressure sensing elements, situated along a chamber—communicating gas passage intermediate the regulator elements and the chamber, for measuring a pressure parameter representative of the rate of gas flow into the chamber.

In accordance with a further aspect of the invention, the control elements include microprocessor elements for automatically calculating the flow rate threshold of sonically choked flow. The microprocessor elements can include first input elements, in electrical circuit with the chamber pressure sensing elements, for reading the pressure signal; second input elements, in electrical circuit with the gas flow sensing elements, for reading the flow rate signal; arithmetic logic elements, responsive to the pressure signal and the flow rate signal, for arithmetically determining the flow rate threshold of sonically choked flow; and output elements for generating the control signals.

The invention also provides a method for controlled the venting of a processing vacuum chamber including the steps of sensing gas conditions in the chamber during venting, and responding to the sensed gas conditions to attain a venting rate approaching a selected maximal venting rate threshold of sonically choked flow, thereby attaining enhanced non-sonically-choked venting.

One particular practice of the invention includes the steps of sensing gas pressure in the chamber and generating a pressure signal representative of gas pressure in the chamber; sensing gas flow rate into the chamber and generating a flow rate signal representative of the rate of gas flow into the chamber; responding to applied control signals to regulate the rate of gas flow into the chamber; and generating the control signals, responsive to the pressure signal and the flow rate signal, to attain a rate of gas flow apaproaching a selected maximal flow rate threshold of sonically choked flow, thereby attaining enhanced non-sonically-choked gas flow. The generating step can include generating the applied control signals to control gas flow as a function of chamber pressure, in particular, to increase gas flow linearly or otherwise in proportion with increasing chamber pressure. The step of responding to applied control signals can include selectively reducing the rate of gas flow into the chamber, and the step of sensing gas flow rate into the chamber can include measuring a pressure parameter representative of the rate of gas flow into the chamber.

In another practice of the invention, the step of generating the applied control signals includes the step of automatically calculating the flow rate threshold of sonically choked flow. The calculation step can include the steps of reading the pressure signal and flow rate signal for calculating the flow rate threshold of sonically choked flow, and generating the applied control signals to be representative of the flow rate threshold of sonically choked flow.

According to the invention, a vacuum chamber in which a workpiece is processed is vented by dynamically controlling the flow of venting gas, as the pressure in the chamber rises from the high vacuum for processing to the vent pressure. The vent pressure typically is at ambient and is the condition under which workpieces are loaded into and out of the chamber. The dynamic control provides a high, maximal level of venting flow close below the level which causes a sonic shock condition in the space being vented. The venting level is accordingly controlled to increase from a low level to progressively higher levels, as the chamber pressure rises. The venting control can be of an open loop type, and preferably for most instances is a regulated, closed loop type. In either instance, the resultant so-called profile venting diminishes particulate contamination of the workpiece by avoiding sonic disturbance of particulates. It also attains a relatively fast and hence brief venting time, and thereby enhances high vacuum processing throughput.

The invention accordingly comprises the steps and apparatus embodying features of construction, combinations of elements and arrangements of parts adapted to effect such steps, as exemplified in the following detailed disclosure, and the scope of the invention is indicated in the claims.

Although the invention is described below with particular reference to the vacuum processing of semiconductor wafers in the manufacture of integrated electronic circuits; the invention is not limited to this illustrative practice and has application to the venting of other vacuum processing equipment and procedures.

BRIEF DESCRIPTION OF DRAWINGS

For a fuller understanding of the nature and objects of the invention, reference should be made to the following detailed description and the accompanying drawings, in which.

DESCRIPTION OF ILLUSTRATIVE EMBODIMENTS

Figure 1:
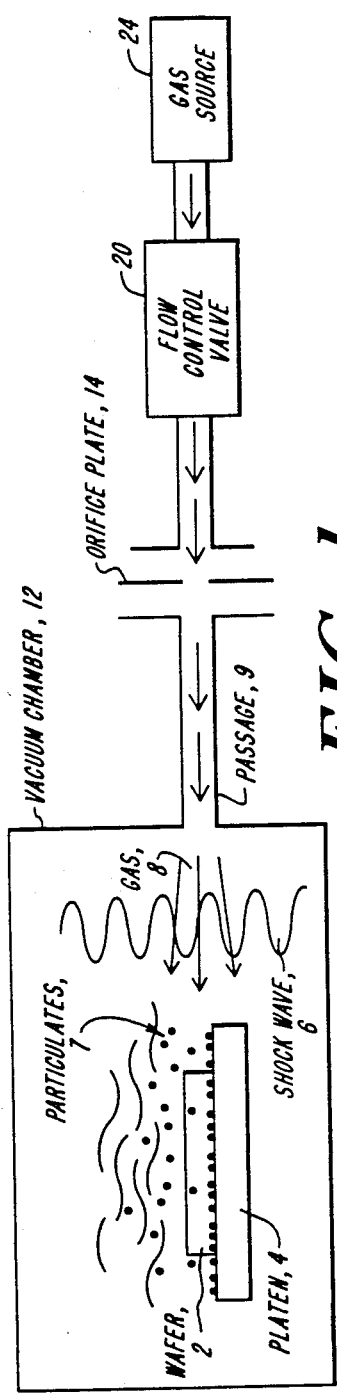
FIG. 1 is a schematic diagram of a vent process utilized with a conventional vacuum chamber for processing semiconductor wafers and illustrating an aerodynamic mechanism of particulate transport during the vent process.

FIG. 1 is a schematic diagram of a conventional vent process utilized in connection with a vacuum chamber 12, for processing a semiconductor wafer 2 mounted on a platen 4. When ion implantation or other processing in the vacuum is completed, the vacuum chamber 12 is vented by the introduction of gas 8 from a gas source 24 through a flow control valve 20, a regulator orifice plate 14, and a chamber-communicating passage 9.

When the vacuum chamber 12 is vented, large aerodynamic forces are developed. This phenomemon is depicted in greater detail in FIG. 1. During an uncontrolled vent cycle, as the vent gas 8 enters the vacuum chamber 12 through the chamber-communicating passage 9, a shock wave 6 forms in the chamber 12. The aerodynamic forces of the shock wave 6 can overcome the attractive forces binding trace particulates 7 to the platen 4 and to interior surfaces of the vavuum chamber 12, and can thereby mobilize the particulates 7. Particulates 7 are then deposited on the wafer, which can result in contamination and rejection of the wafer.

In physical systems involving high velocity gas flow through short tubes and small apertures, such as those depicted in FIG. 1, if the pressure P1 on one side of the tube is relatively low, and the pressure P2 on the opposite side of the tube is relatively high, e.g. near atmospheric, then the flow velocity in the tube increases until it reaches the velocity of sound. Under this condition, the pressure ratio (r) defined by $$r = P1/P2 \qquad \text{(Eq. 1)}$$

approaches a critical value, so that a further reduction in pressure P1 produces no increase in flow velocity or rate of flow, and a further increase in P2 results in a shock wave of increased energy. This critical pressure ratio, designated ($r_c$), has been calculated to range from approximately 0.49 for monatomic gases to approximately 0.60 for multi-atomic gases. It is 0.53 for nitrogen, $N_2$, which is a vent gas commonly used in semiconductor fabrication.

Thus, with reference to FIG. 1, at a critical ratio of vacuum chamber 12 pressure (P1) to exterior or vent pressure (P2), e.g. the pressure of the gas source 24, flow velocity in passage 9 increases to sonic velocity at the surface of wafer 2. This condition is referred to as "sonically choked" flow. The shock wave 6 develops when sonically choked flow velocity is attained. The shock wave sharply increases turbulence in chamber 12 and increasingly overcomes the attractive forces between particles 7 and surfaces within chamber 12 on which the particles were resting.

In accordance with the invention, the vent gas flow velocity or venting rate is controlled dynamically to approach, but not exceed, the flow rate threshold or pressure threshold of sonically choked flow. This control of the venting gas flow can reduce and even eliminate the shock wave illustrated in FIG. 1. The invention thereby significantly reduces turbulence and resultant contamination. Moreover, this selected control of venting maximizes the non-sonically-choked venting rate, and thereby shortens the equipment processing cycle and correspondingly increases production throughput.

Figure 2:
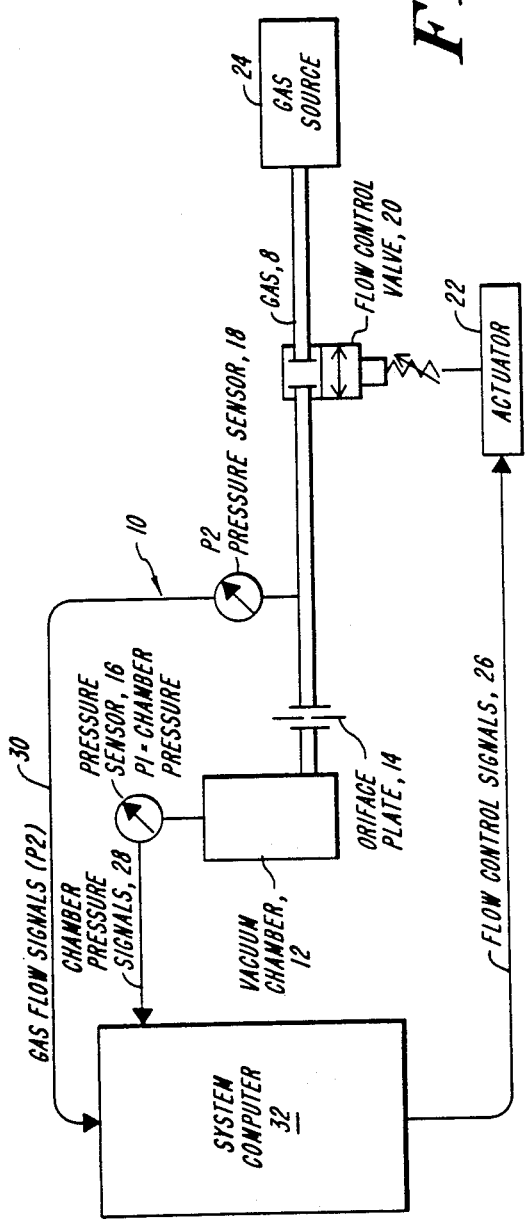
FIG. 2 is a schematic diagram depicting of a venting system in accordance with the invention.

FIG. 2 is a schematic diagram depicting a profile venting system 10 in accordance with the invention, for providing such control of vent rate. The illustrated profile venting system 10 utilizes a pressure sensor 16, which can be a conventional vacuum gauge, to sense pressure P1 within vacuum chamber 12, and for generating chamber pressure signals 28 representative of the chamber pressure P1. In a preferred embodiment of the invention, a system computer 32 of conventional design is connected to receive the sensor 16 signals 28 for reading and processing them. The system computer 32 utilized in conjunction with the invention can be a conventional microprocessor, computer, analog circuit, computational device or the like, constructed and programmed in accordance with this description with skills known in the art.

The illustrated system 10 also has a vent pressure sensor 18, which can, for example, be a conventional pressure gauge, for sensing the controlled vent pressure, which is the pressure of vent gas 8 as delivered from the gas source 24 through the flow control valve 20. The pressure sensor 18 is preferably arranged to sense pressure at a location between the flow control valve 20 and the regulator orifice plate 14, which as conventional establishes a fixed maximum attainable vent rate. The illustrated pressure sensor 18 produces pressure signals 30 representative of the controlled vent pressure (P2). These pressure signals 30 are asserted at another input of the system computer 32.

In response to the received vent pressure signals 30 and the chamber-pressure signals 28, the system computer generates flow control signals 26, which are transmitted to a valve actuator 22. The actuator 22 is coupled to the flow control valve 20, for operating the valve to modulate, or otherwise dynamically regulate the rate of the vent gas 8 which it admits to the passage 9. The algorithm by which system computer 32 generates the flow control signals 26 is discussed in greater detail below in connection with FIG. 3.

Figure 3:
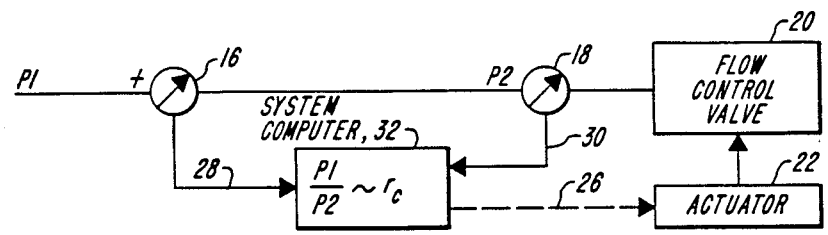
FIG. 3 is an electrical block diagram of the control loop provided by a preferred embodiment of the system of FIG. 2.

FIG. 3 is a block diagram of a control loop provided by a preferred embodiment of the system 10 of FIG. 2. As FIG. 3 illustrates, the system computer 32 receives pressure signals 28 representative of chamber pressure P1, and pressure signals 30 representative of controlled vent pressure P2. In accordance with Equation 1 above, the system computer 32 compares the magnitudes of the pressures P1 and P2, and continuously adjusts the output control signal 26 to maintain the observed (P1/P2) ratio essentially at the critical pressure ratio for the particular vent gas which is being controlled. In actual practice, the control maintains a pressure ratio which is greater than this critical ratio by a selected threshold amount. The threshold value reflects, in part at least, parameters of the actual control system according to known fluid control system designs and can, by way of illustrative example, be ten percent of the selected ratio value.

In particular, if the system computer 32 detects that the vent rate is less than optimum, i.e. that the P1/P2 ratio exceeds the selected value by more than the selected threshold, the system computer 32 transmits to the actuator 22 a control signal 26 which increasingly opens the flow control valve 20. The increased valve opening increases the vent pressure P2 to a point at which the system computer 32 detects the desired (P1/P2) pressure ratio.

Figure 4A:
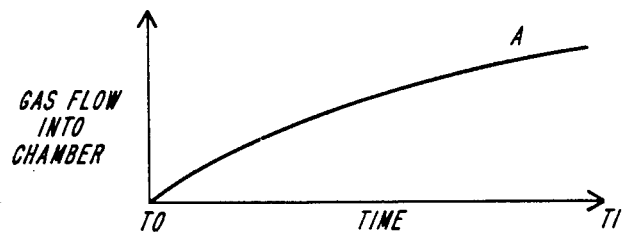
FIG. 4A is a graph depicting the time/flow rate relationhsip provided by the system of FIG. 2.
Figure 4B:
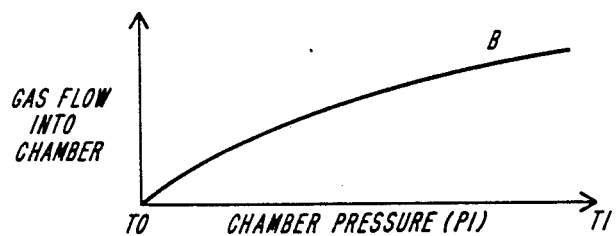
FIG. 4B is a graph depicting the pressure/flow rate relationship provided by the system of FIG. 2.

Moreover, as a vent operation progresses and the pressure inside the vacuum chamber approaches the pressure of the gas source 24, i.e. as the chamber pressure P1 increases, the system computer 32 drives the actuator 22, by way of the signal 26, to increase the valve opening of control valve 20. This operation increases the venting flow rate. Correspondingly, the controlled vent pressure P2 increases, and the (P1/P2) pressure ratio maintains the selected value. With this operation, the system computer 32 provides time/flow and pressure/flow profiles as illustrated in FIGS. 4A and 4B, respectively. The graph of FIG. 4A shows an example of a time/flow rate profile A provided by the embodiment of the invention of FIG. 2 when operating as discussed with reference to FIG. 3. Profile A is a plot of gas flow in terms, for example, of standard cubic centimeters per second, into the process chamber, and hence in passage 9, as a function of time. The venting gas flow has minimal value at time T0, the time at which the venting of chamber 12 begins. The system 10 of FIGS. 2 and 3 operates valve 20 to increase the vent flow rate to maintain the (P1/P2) pressure ratio at the selected level. The illustrated increase in venting flow rate is continuous. At time T1, the flow rate is at a maximum level established by the regulator orifice plate.

The graph of FIG. 4B shows a profile B of vent gas flow as a function of the chamber pressure, P1, over the same T0–T1 interval. The graph shows that the system which the invention provides attains a venting gas flow into the chamber that increases as a function of increasing chamber pressure (P1). This operation is consistent with the objective of maintaining the (P1/P2) ratio at a selected value. As Equation 1 indicates, vent flow velocity is to be restricted at the start of the vent cycle, when the pressure P1 is at a minimum. Those skilled in the art will appreciate that the vacuum conditions of the chamber at the start of the vent operation provide relatively few gas molecules in the vicinity of the wafer to provide a protective flow boundary layer. Thus, as the vent gas enters the chamber, the scant boundary layer readily dissipates, and local velocity at the surface of the wafer rapidly approaches sonic velocity.

The maintenance of the (P1/P2) pressure ratio at a selected value in accordance with the invention as discussed above, and as a function of the venting gas, eliminates sonically choked flow, and eliminates the resulting shock wave and excessive turbulence which mobilizes particulates. It thereby reduces the tendency for contamination of the wafer or other workpiece being processed by particulates that invariably are present. A significant further feature is that the maintenance of an optimum (P1/P2) ratio in accord with the invention attains a maximal venting flow that is not sonically choked. It thereby attains rapid venting, and hence enhances processing speed and throughput.

The regulation of vent rate to produce vent profiles like those illustrated in FIGS. 4A and 4B is understood to reduce vent time by the order of a half, with substantially no particle contamination. This is in contrast to certain prior art venting systems, which significantly reduce vent rate throughout the vent cycle. A reduction in vent time by one-half in turn speeds up overall process time for ion implantation by an order of ten percent or more. Those skilled in the art will appreciate that while the invention has been described in connection with a preferred closed-loop control operation, the invention can be practiced in connection with open-loop control. In one such open-loop system, the opening of the control valve 20 is varied as a function of time, to maintain the specified (P1/P2) ratio, based on calculated or previously measured system parameters such as chamber volume, process gas type, and process gas supply pressure.

It will thus be seen that the invention efficiently attains the objects set forth above, among those made apparent from the preceding description. In particular, the invention provides methods and apparatus which reduce particulate contamination in semiconductor wafer vacuum processing by turbulent flow while maintaining high processing speeds and throughput.

Among the modifications and changes with which the invention can be practiced are the use of a flow-rate sensor, in lieu of the pressure sensor 18 described with reference to the embodiments of FIGS. 2 and 3. The system computer 32 is modified accordingly, to respond to and process the flow-rate information from such a sensor. Those skilled in the art will understand that the invention is described with reference to an orifice plate 14 for clarity, and that a separate such element need not be present in every embodiment. The vent conduit 9, for example, can function as an orifice element.

It will thus be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. In semiconductor processing apparatus including a process chamber which can be alternatively evacuated and vented, the improvement comprising
   A. sensing means for sensing gas conditions in the chamber, and
   B. vent rate control means responsive to said sensing means for attaining a venting rate approaching a selected maximal venting rate threshold of sonically choked flow, thereby attaining enhanced non-sonically-choked venting.

2. In semiconductor processing apparatus including a process chamber which can be alternatively evacuated and vented through a chamber-communicating gas passage for conducting gas out of and into the chamber, an improvement comprising
   A. chamber pressure sensing means for sensing gas pressure in the chamber and for generating a pressure signal representative of gas pressure in the chamber,
   B. gas flow sensing means for sensing gas flow rate into the chamber and for generating a flow rate signal representative of the rate of gas flow into the chamber,
   C. regulator means arranged for regulating the rate of gas flow into the chamber in response to an applied control signal, and
   D. control means, connected with said chamber pressure sensing means and said gas flow sensing means, for generating said applied control signal responsive to said pressure signal and said flow rate signal, for attaining a rate of gas flow into the chamber approaching a selected maximal flow rate threshold of sonically choked flow, thereby attaining enhanced non-sonically-choked gas flow.

3. In apparatus according to claim 2 the further improvement wherein said control means includes pressure-responsive means for generating said applied control signals to control gas flow as a function of chamber pressure.

4. In apparatus according to claim 3 the further improvement wherein said pressure-responsive means includes means for generating said applied control signals to increase gas flow with increasing chamber pressure.

5. In appraratus according to claim 2 the further improvement wherein said regulator means includes valve means for selectively reducing the rate of gas flow into the chamber.

6. In apparatus according to claim 5 the further improvement wherein said gas flow sensing means include pressure sensing means, situated along the chamber-communicating gas passage intermediate said regulator means and the chamber, for measuring a pressure parameter respresentative of the rate of gas flow into the chamber.

7. In apparatus according to claim 2 the further improvement wherein said control means includes microprocessor means for automatically calculating said flow rate threshold of sonically choked flow.

8. In apparatus according to claim 7 the further improvement wherein said microprocessor means includes
   A. first input means, in electrical circuit with said chamber pressure sensing means, for reading said pressure signal,
   B. second input means, in electrical circuit with said gas flow sensing means, for reading said flow rate signal,
   C. arithmetic logic means, responsive to said pressure signal and said flow rate signal, for calculating said flow rate threshold of sonically choked flow, and
   D. output means, for generating said applied control signals.

9. In a semiconductor processing method, including the steps of alternatively evacuating and venting a process chamber, an improvement comprising the steps of:
   A. sensing gas conditions in the chamber, and
   B. responding to said sensed gas conditions to attain a venting rate approaching a selected maximal venting rate threshold of sonically choked flow, thereby attaining enhanced non-sonically-choked venting.

10. In a semiconductor processing method, including the steps of alternatively evacuating and venting a process chamber through a chamber-communicating gas passage for conducting gas out of and into the chamber, an improvement comprising the steps of
    A. sensing gas pressure in the chamber and generating a pressure signal respresentative of gas pressure in the chamber,
    B. sensing gas flow rate into the chamber and generating a flow rate signal representative of the rate of gas flow into the chamber,
    C. responding to applied control signals to regulate the rate of gas flow into the chamber, and
    D. generating said applied control signals, responsive to said pressure signal and said flow rate signal, to attain a rate of gas flow into the chamber approaching a selected maximal flow rate threshold of sonically choked flow, thereby attaining enhanced non-sonically-choked gas flow.

11. In a method according to claim 10 the further improvement wherein the generating step includes the step of generating said applied control signals to control gas flow as a function of chamber pressure.

12. In a method according to claim 11 the further improvement wherein the generating step includes the step of generating said applied control signals to increase gas flow linearly with increasing chamber pressure.

13. In a method according to claim 10 the further improvement wherein the step of responding to applied control signals includes the step of selectively reducing the rate of gas flow into the chamber.

14. In a method according to claim 10 the further improvement wherein the step of sensing gas flow rate into the chamber includes the step of measuring a pressure parameter, at a point outside the chamber, representative of the rate of gas flow into the chamber.

15. In a method according to claim 10 the further improvement wherein the step of generating said applied control signals includes the step of automatically calculating said flow rate threshold of sonically choked flow.

16. In a method according to claim 15 the further improvement wherein the step of automatically calculating said flow rate threshold of sonically choked flow includes the steps of
    A. reading said pressure signal,
    B. reading said flow rate signal,
    C. responding to said pressure signal and said flow rate signal for calculating said flow rate threshold of sonically choked flow, and
    D. generating said applied control signals to be representative of said flow rate threshold of sonically choked flow.

* * * * *